US009403322B2

(12) United States Patent
Das et al.

(10) Patent No.: US 9,403,322 B2
(45) Date of Patent: Aug. 2, 2016

(54) SYSTEMS AND METHODS FOR FABRICATING THREE-DIMENSIONAL OBJECTS

(71) Applicants: Georgia Tech Research Corporation, Atlanta, GA (US); The Regents of the University of Michigan, Ann Arbor, MI (US)

(72) Inventors: Suman Das, Atlanta, GA (US); John W. Halloran, Ann Arbor, MI (US)

(73) Assignees: GEORGIA TECH RESEARCH CORPORATION, Atlanta, GA (US); THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 412 days.

(21) Appl. No.: 14/132,835

(22) Filed: Dec. 18, 2013

(65) Prior Publication Data

US 2014/0103581 A1 Apr. 17, 2014

Related U.S. Application Data

(62) Division of application No. 12/435,776, filed on May 5, 2009, now Pat. No. 8,636,496.

(60) Provisional application No. 61/050,383, filed on May 5, 2008.

(51) Int. Cl.
*B29C 67/00* (2006.01)
*G03B 27/42* (2006.01)
*G03F 7/20* (2006.01)

(52) U.S. Cl.
CPC ............ *B29C 67/0066* (2013.01); *G03B 27/42* (2013.01); *G03F 7/2057* (2013.01); *G03F 7/70291* (2013.01); *G03F 7/70416* (2013.01)

(58) Field of Classification Search
CPC .............. B29C 67/0066; G03F 7/2057; G03F 7/70416
See application file for complete search history.

(56) References Cited

U.S. PATENT DOCUMENTS 4,575,330 A 3/1986 Hull
2,492,425 A 5/1990 Jain
(Continued)

FOREIGN PATENT DOCUMENTS

EP 2011631 A1 1/2009
GB 2315700 A 2/1998
WO 2007138356 A1 12/2007

OTHER PUBLICATIONS

Wang, L. et al., "Scanning Array Lens Lithography for Large Area Applications", Ultratech Stepper, Inc., Advanced Technology Group, Proceedings of SPIE, vol. 3048, Mar. 10, 1997, pp. 271-286.
(Continued)

*Primary Examiner* — James Sanders
(74) *Attorney, Agent, or Firm* — Troutman Sanders LLP; Ryan A. Schneider; Parker D. Hancock

(57) ABSTRACT

Systems and methods for fabricating three-dimensional objects are disclosed. The system includes an optical imaging system providing a light source; a photosensitive medium adapted to change states upon exposure to a portion of the light source from the optical imaging system; a control system for controlling movement of the optical imaging system, wherein the optical imaging system moves continuously above the photosensitive medium. The method includes moving a maskless optical imaging system providing the light beam in a continuous sequence; presenting the light beam on a portion of the photosensitive medium; lowering a plate upon which the photosensitive medium resides; and applying a new layer of the photosensitive medium.

20 Claims, 11 Drawing Sheets

(56) References Cited

U.S. PATENT DOCUMENTS

| | | | |
|---|---|---|---|
| 5,253,177 A | 10/1993 | Saito et al. | |
| 5,263,130 A | 11/1993 | Pomerantz et al. | |
| 5,331,338 A | 7/1994 | Mager | |
| 5,351,617 A | 10/1994 | Williams et al. | |
| 5,496,682 A | 3/1996 | Quadir et al. | |
| 5,691,541 A | 11/1997 | Ceglio et al. | |
| 5,870,176 A | 2/1999 | Sweatt et al. | |
| 5,980,813 A | 11/1999 | Narang et al. | |
| 6,051,179 A | 4/2000 | Hagenau | |
| 6,060,224 A | 5/2000 | Sweatt et al. | |
| 6,117,672 A | 9/2000 | Breckenridge | |
| 6,153,142 A * | 11/2000 | Chari | B29C 41/46 264/308 |
| 6,177,980 B1 | 1/2001 | Johnson | |
| 6,180,050 B1 | 1/2001 | Arai et al. | |
| 6,251,550 B1 | 6/2001 | Ishikawa | |
| 6,270,335 B2 | 8/2001 | Leyden et al. | |
| 6,312,134 B1 * | 11/2001 | Jain | G03F 7/70291 355/35 |
| 6,500,378 B1 | 12/2002 | Smith | |
| 6,567,205 B1 | 5/2003 | Eggers et al. | |
| 6,768,505 B2 | 7/2004 | Zelenka | |
| 6,777,170 B1 | 8/2004 | Bloomslein et al. | |
| 6,844,920 B2 | 1/2005 | Luellau | |
| 6,914,708 B2 | 7/2005 | Mi | |
| 6,932,145 B2 | 8/2005 | Frasier et al. | |
| 7,006,887 B2 | 2/2006 | Nagano et al. | |
| 7,049,049 B2 | 5/2006 | Fries | |
| 7,052,263 B2 | 5/2006 | John | |
| 7,195,472 B2 | 3/2007 | John | |
| 2008/0038396 A1 | 2/2008 | John et al. | |
| 2008/0255003 A1 | 10/2008 | Piletsky et al. | |

OTHER PUBLICATIONS

Wang, L. et al., "New Array Lens Optical System for Large Area Micromachining Lithography", Ultratech Stepper, Inc., Advanced Technology Group, Proceedings of SPIE, vol. 2880, Oct. 14, 1996, pp. 210-223.

UV-Setter Series 5 Brochure, BasysPrint, Punch Graphix International NV, 2006, pp. 1-8.

* cited by examiner

SYSTEMS AND METHODS FOR FABRICATING THREE-DIMENSIONAL OBJECTS

CROSS REFERENCE TO RELATED APPLICATIONS

This application is a divisional of, and claims priority under 35 U.S.C. §121 to, U.S. patent application Ser. No. 12/435,776 filed May 5, 2009 of the same title, which claims benefit, under 35 U.S.C. §119(e), of U.S. Provisional Application Ser. No. 61/050,383, filed May 5, 2008, the entire contents and substance of which are hereby incorporated by reference.

STATEMENT REGARDING FEDERALLY SPONSORED RESEARCH OR DEVELOPMENT

This invention was made with government support under grants HR0011-07-1-0034 and HR0011-08-1-0075, awarded by the Defense Advanced Research Projects Agency (DARPA). The federal government has certain rights in the invention.

BACKGROUND

Rapid prototyping or solid free-form fabrication has become an increasingly important tool, and is a technology that has seen great advances since its initial application in the 1980s, evidenced in U.S. Pat. No. 4,575,330, which is incorporated by reference herein as if fully set forth below. In one common embodiment known as stereolithography, rapid prototyping manufacturing makes use of a bath of curable liquid, wherein some movable point within the bath is subjected to stimulation by a prescribed curing source. As the source is moved with respect to the bath or as the bath is moved with respect to the source, the point that undergoes solidification or curing is constantly made to move. The result is the construction of a solidified mass of cured material contained within the otherwise liquid bath. The region commonly solidified is positioned at or very near the surface of the bath in most practical applications. As the liquid is solidified, the solid structure is progressively lowered into the bath allowing the uncured liquid to flow over the surface, which is in turn subjected to the same process. By continuing to solidify these very thin layers, the solid object is built up into its final shape. Bonding of one layer to a previous layer is an inherent property of the process as is known in the art.

For example, photolithography systems that direct light beams onto a photosensitive surface covered by a mask, etching a desired pattern on the substrate corresponding to the void areas of the mask, are known in the art. In mask-based photolithography systems, the patterns generated are defined by physical masks placed in the path of light used for photoactivation. While effective, the use of physical masks in photolithography has numerous drawbacks, including the cost of fabricating masks, the time required to produce the sets of masks needed to fabricate semiconductors, the diffraction effects resulting from light from a light source being diffracted from opaque portions of the mask, registration errors during mask alignment for multilevel patterns, color centers formed in the mask substrate, defects in the mask, the necessity for periodic cleaning, and the deterioration of the mask as a consequence of continuous cleaning.

Maskless photolithography systems are also known in the art and often use an off-axis light source coupled with a digital micromirror array to fabricate chips containing probes for genes or other solid phase combinatorial chemistry to be performed in high-density microarrays.

While maskless photolithography systems address several of the problems associated with mask-based photolithography systems, such as distortion and uniformity of images, problems still arise. Notably, in environments requiring rapid prototyping and limited production quantities, the advantages of maskless systems as a result of efficiencies derived from quantities of scale are not realized. Further, while maskless photolithography systems are directed to semiconductor manufacturing, these prior art systems and methods notably lack reference to other applications lending themselves to maskless photolithography techniques.

A commonly-used curable medium includes photopolymers, which are polymerizable when exposed to light. Photopolymers can be applied to a substrate or objects in a liquid or semi-liquid form and then exposed to light, such as ultraviolet light, to polymerize the polymer and create solid coatings or castings. In addition, conductive photopolymers are known that exhibit electrically conductive properties, allowing creation of electric circuits by polymerizing the polymers in circuit layout patterns. Conventional methods of photopolymerization, however, use physical masks to define areas of polymerization. This mask-based photopolymer process suffers from the disadvantages of mask-based photolithography methods, including the requisite need for many different masks, long lead time for mask creation, inability to modify masks, and the degradation of masks used in the manufacturing process.

As one can imagine, there are many advantages of rapid prototyping. For example, the rapid prototyping process has the ability to drastically reduce the time between product conception and final design, and to create complex shapes. More traditional modeling or prototyping is obtained from an iterative generation of a series of drawings which are analyzed by the design team, manufacturing, the consumer, and perhaps others, until a tentative final design results which is considered viable. This agreed upon design is then created by casting and/or machining processes. If molds are needed, these must be fabricated as well, which can take considerable and valuable time. The finished prototype is then tested to determine whether it meets the criteria for which the part was designed. The design and review process is often tedious and tooling for the creation of the prototype is laborious and expensive. If the part is complex, then a number of interim components must first be assembled. The prototype itself is then constructed from the individual components.

Use of rapid prototyping significantly reduces the expense and time needed between conception and completion of the prototype. Commonly, the concept is rendered in CAD (computer aided design). As this process is fully electronic, drawings are not required for fabrication. The CAD system is used to generate a compatible output data file that contains information on the part's geometry. This file is typically converted into a "sliced" data file that contains information on the part's cross-section at predetermined layer depths. The rapid prototype control system then regenerates each cross-section sequentially at the surface of the curable resin. The fabricated part can be analyzed by the team or used for various form, fit, and functional tests. Due to the rapid speed and low cost of the process, several designs can be fabricated and evaluated in a fraction of the time and for significantly less than it would take to machine each concept. Because the rapid prototyping process creates the structure by the creation of very thin layers, complex components with internal complexities can be easily rendered without requiring the assembly of a plurality of individual components.

On the other hand, one conventional and significant disadvantage of rapid prototyping, other than initial costs to implement technology, is that the time associated with the creation of each part can still be longer than desired. Because creation of the part occurs in a point-by-point, layer-by-layer process, the time necessary to produce a single part can become excessive. Reduction in fabrication times continues to be a desirable goal. Though the above description pertains to the process of stereolithography; the process, as well as the general advantages and disadvantages are similar for other rapid prototyping technologies.

SUMMARY

Embodiments of the present invention relate to optical modeling methods and systems and, more particularly, to optical modeling methods and systems in which a three-dimensional object is created by a continuously moving optical imaging source using a plurality of light beams to illuminate portions of a photo-curable medium. Furthermore, embodiments of the present invention relate to systems and processes for large area maskless photopolymerization (LAMP) using spatial light modulators (SLMs).

For example, a process/system of the present invention involves using SLMs that scan at least a portion of the surface of a photopolymer. In scanning a surface of the photopolymer, the SLMs project a two-dimensional image (e.g., from a CAD file) thereon. The two-dimensional image comprises a cross-section of a three-dimensional object to be formed within the various layers of the photopolymer, once cured.

The process/system involves continuous movement of the SLMs, instead of so-called "step and expose" or "step and repeat" movements. In providing continuous movement, the two-dimensional image projected by the SLMs is a dynamic image. That is, rather than projecting a fixed, single image on a portion of the photopolymer surface, followed by movement of the SLMs to a new location, changing the SLMs to a new image that corresponds to the desired image over the new location, and projection of the new image on the portion of the photopolymer surface at the new location, embodiments of the present invention involve projecting an image that continuously changes as the SLMs scan over the surface of the photopolymer.

Embodiments of the present invention also provide optional features that can overcome some of the limitations of conventional systems and methods, such as polymerization shrinkage, liquid polymer movement prior to being cured, and the like. Further, a combination of increased resolution and speed of fabrication can be achieved. Examples of improvements in the LAMP systems that result in such properties can be found at least in the polymer container design, light modulation process, and light patterns.

The systems and processes above are not limited to photopolymers alone. For example, composite materials (e.g., those that contain a filler material for the polymer), can be employed as well. Alternatively, if a ceramic body is desired, a polymer-ceramic matrix can be used in the LAMP systems and processes, followed by removal of the polymeric component, thereby leaving behind a ceramic body that can be subjected to additional processing.

These and other objects, features, and advantages of the present invention will become more apparent upon reading the following specification in conjunction with the accompanying drawings.

DETAILED DESCRIPTION

Figure 1:
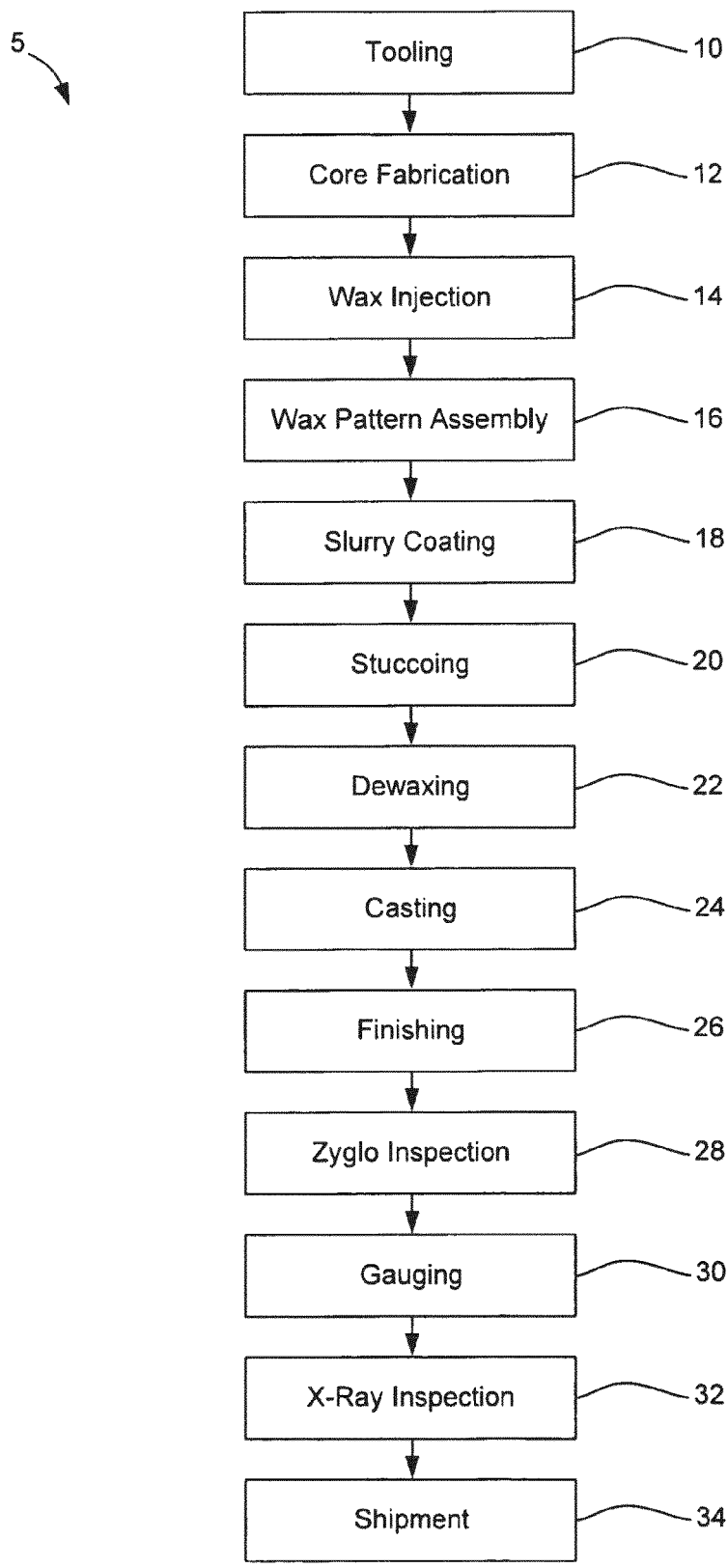
FIG. 1 is a flow chart of a conventional foundry for investment casting of three-dimensional objects.

To facilitate an understanding of embodiments, principles, and features of the present invention, they are explained hereinafter with reference to implementation in illustrative embodiments. In particular, they are described in the context of being a continuously moving rapid prototyping system and method.

Embodiments of the present invention, however, are not limited to use in the described systems. Rather, embodiments of the present invention can be used when a three-dimensional prototype object, e.g., a casting, is desired or necessary. Thus, the system described hereinafter as a continuously moving rapid prototyping system and method can also find utility as a system for many applications and for many sized objects.

The components described hereinafter as making up the various embodiments are intended to be illustrative and not restrictive. Many suitable components that would perform the same or a similar function as the materials described herein are intended to be embraced within the scope of embodiments of the present invention.

Referring now to the figures, wherein like reference numerals represent like parts throughout the views, embodiments of the present invention will be described in detail.

FIG. 1 illustrates a conventional foundry flow chart for investment casting of three-dimensional objects. For example, the flow chart illustrated in FIG. 1 could be utilized to create turbine airfoils; turbine airfoils with extremely complex interior cooling passages are often produced by investment casting. The exterior airfoil shape is defined by injection molded wax patterns that are removed or "lost" after shelling. The interior passages of the airfoil are defined by injection molded ceramic cores that are removed or "lost" after casting.

The core and wax molding operations require sophisticated tooling, leading to excessive initial and maintenance costs, very slow fabrication cycles, and low casting yields.

The process 5 of FIG. 1 begins with the creation of all the tooling 10 necessary to fabricate the cores, patterns, mold, and setters for casting the items, typically involving over a thousand tools for each item. The next step involves fabrication 12 of ceramic cores by injection molding. Molten wax can also be injection molded 14 to define the patterns for the object's shape. Several such wax patterns are then assembled 16 into a wax pattern assembly or tree. The pattern assembly is then subjected to multiple rounds of slurry coating 18 and stuccoing 20 to form the completed mold assembly. The mold assembly is then placed in an autoclave for dewaxing 22. The result is a hollow ceramic shell mold into which molten metal is poured to form the castings 24. Upon solidification, the ceramic mold is broken away and the individual metal castings are separated therefrom. The castings are next finished 26, 28, 30 and inspected 32 prior to shipment 34.

As a result of the embodiments of the present invention, conventional casting steps 10, 12, 14, 16, 18, 20, 22 are obsolete, resulting in the elimination of over 1,000 tools and five major process steps of three-dimensional item prototyping.

As mentioned, there are major obstacles for conventional rapid prototyping. For example, despite the maturity of current investment casting practices, particularly in the aerospace industry, a major challenge exists in the affordable, high-yield, production of cooled, single crystal nickel-superalloy turbine airfoils for jet engines. While many improvements in the performance of designs have been made, no known, significant improvements have been made to lower the cost of manufacturing turbine airfoils. Improvements in turbine airfoil designs have vastly outpaced commensurate improvements in investment casting capability.

In gas turbine engines, for example, it is well established that the turbine engines can achieve higher performance, such as greater power density and lower Specific Fuel Consumption (SFC) by operating at higher temperatures. Turbine airfoils lay at the heart of gas turbine engines, operating at the highest temperatures—even in excess of their melting point. Because turbine airfoils are subjected to very high heat, there has been a continuing effort to identify improvements to the design, materials, and coatings for turbine airfoils to achieve even higher temperature capability and thus higher performance—typically at the sacrifice of affordability. Over the past four decades, materials have improved from wrought alloys to fourth generation single crystal superalloys; designs have improved from uncooled solid airfoils to highly convectively effective and highly film effective, impingement cooled airfoils; and coatings have been developed to environmentally and thermally protect airfoils. Although commensurate manufacturing methods have been developed to make more sophisticated alloys, designs, and coatings producible, very little has been done to reduce the costs of these manufacturing processes, particularly investment castings, or rapid prototyping.

Figure 2:
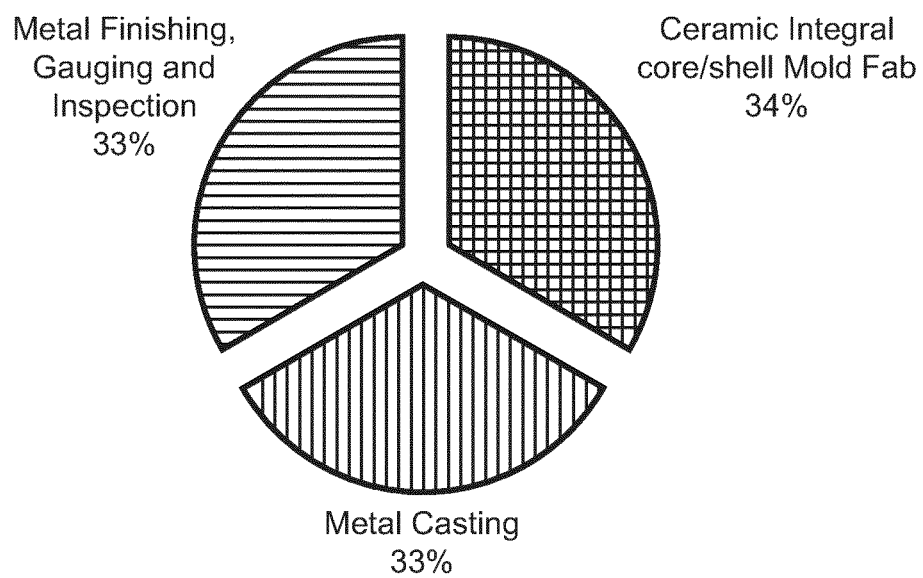
FIG. 2 is a pie chart of a conventional perfectly yielded investment cast object.

The cost of investment casting an object, e.g., a turbine airfoil, is established by material usage, and handling and finishing costs, but the final "sell" price is primarily driven by casting yield (cost of poor quality). To dramatically lower the sell price of manufacturing of objects, improvements of embodiments of the present invention can be made in casting yield and secondarily through a reduction in handling, which also impacts casting yield. As shown in FIG. 2, for a perfectly yielded investment cast object, typically a third of the cost is comprised of manufacturing the integral core/shell "lost" mold (steps 10-22 of FIG. 1); a third of the cost is metal pouring; and a third of the cost is finishing, gauging, and inspecting the finished metal casting. Where casting yield is low, however, the cost of making integral core/shell molds dominates more of the overall costs, sometimes commanding up to half of the cost of an investment casting. In sum, for a yielded object casting, cost is evenly divided among manufacturing the mold, casting, and finishing, as illustrated in FIG. 2.

The cost of manufacturing the "lost" integral core/shell is a large part of the cost of an investment cast object because approximately 60-90% percent of the causes for low casting yield occur in fabrication and handling of the cores 12, wax injection 14 and dewaxing 22; whereas relatively less scrap is typically caused by metal pouring and finishing, steps 24, 26, 28, 30, 32, 34. Causes are typically due to the enormous amount of handling and handling-induced variation and damage that occurs in the fabrication of cores, injection of wax around the cores, and subsequent high stresses placed on the cores during dewaxing. Core fracture and breakage, hand finishing breakage, wax injection-induced core fracture, breakage and shift, and core shift and shell defects caused during dewaxing typically lead to downstream yield problems such as kiss-out, miss-run, recrystallized grains, surface defects, inclusions, and other defects detected after casting. Unfortunately, early causes for low casting yield are not discovered until after the metal has been cast, the shell and core removed, and the metal component is inspected. Although some incremental productivity improvements have been made, such as semi-automated finishing and handling, none have dramatically lowered the cost of investment casting turbine airfoils. Elimination of the "lost" processes and accompanying tooling and handling by directly digitally manufacturing the investment casting mold can dramatically increase production yields, reduce costs and lead-times.

Embodiments of the present invention relate to systems and methods that develop a disruptive manufacturing technology for the direct digital manufacturing (DDM) of three-dimensional items or objects, such as airfoils. Embodiments of the present invention are based on large area maskless photopolymerization (LAMP) of photocurable materials (e.g., photopolymers alone, composites comprising a photopolymer, ceramic- or ceramic-precursor-filled photopolymers, metals, and the like).

As mentioned, referring to FIG. 1, LAMP can be used, in some embodiments, to produce integral ceramic cored molds ready for step 24, i.e., the casting step. As such, DDM of items using LAMP will replace and thus eliminate steps 10-22, amounting to the elimination of over 1,000 tools and five major processes with a single step corresponding to direct digital mold production. Accordingly, LAMP will fundamentally eliminate at least approximately 95% percent or more of tooling and tooling costs, at least approximately 20-30% of the overall part cost, and at least approximately 60-90% of the causes for low casting yield. LAMP may enable in situ casting of more sophisticated features, such as film cooling holes, that are otherwise difficult or physically impossible to cast with conventional investment casting processes, further improving casting yield and dramatically improving downstream machining yields and costs.

Exemplary embodiments of the present invention relate to a both a system and a method for fabricating a three-dimensional object.

In an exemplary embodiment, the system for fabricating a three-dimensional object includes an optical imaging system for providing a light source, a photosensitive medium that is adapted to change states, and a control system for continuously moving the optical imaging system above the medium. The optical imaging system can use a spatial light modulator (SLM) to scan a portion of the surface of the medium housed in a container. In an exemplary embodiment, the medium is a photopolymer. As the optical imaging system scans the medium, when the light source illuminates a portion of the surface of the medium, the characteristics of the medium change, e.g., from a liquid or aqueous state to the solid state.

In an exemplary embodiment, the optical imaging system or radiation system includes a light source, a reflector system, an optical lens system, a mirror, the SLM comprising a digital mirror device (DMD), and a projection lens. In operation, the light source can comprise an ultraviolet light, e.g., having a particular, predetermined wavelength in the UV spectrum. Various embodiments of the present invention can include light sources comprising any one of an ultraviolet light, violet light, blue light, green light, actinic light, and the like. The light emitting from the light source can be directed upon a portion of the reflector system, and thus reflects from the reflector system, which can comprise a concave-shaped reflector. The reflector of the reflector system directs the light through a lens of the optical lens system before it reaches a mirror. The mirror then reflects the light towards the digital mirror device (DMD). The DMD is a microelectromechanical device comprising a plurality of tiny mirrored surfaces that each can be independently pivoted from a first to a second position. The mirrors are formed into the surface of a semiconductor chip and through the application of an appropriate voltage to the circuitry built under each mirror, that mirror may be made to tilt to one side or another with respect to a plane normal to the semiconductor chip. With respect to some fixed frame of reference, pivoting in one direction causes the mirror to reflect light whereas pivoting in the opposite direction causes the light to be deflected from the fixed frame of reference. The light from the DMD is next directed towards a projection lens. The light then is projected onto the surface of the medium in the container. Other types of SLMs, such as liquid crystal displays, variant grade values, and the like, can also be implemented.

For example, one process/system involves using SLMs that scan at least a portion of the surface of a photopolymer. In scanning a surface of the photopolymer, the SLMs project a two-dimensional image (e.g., from a CAD file) thereon. The two-dimensional image comprises a cross-section of a three-dimensional object to be formed within the various layers of the photopolymer, once cured.

The process/system involves continuous movement of the SLMs, instead of so-called "step and expose" or "step and repeat" movements. In providing continuous movement, the two-dimensional image projected by the SLMs is a dynamic image. That is, rather than projecting a fixed, single image on a portion of the photopolymer surface, followed by movement of the SLMs to a new location, changing the SLMs to a new image that corresponds to the desired image over the new location, and projection of the new image on the portion of the photopolymer surface at the new location, embodiments of the present invention involve projecting an image that continuously changes as the SLMs scan over the surface of the photopolymer.

As alluded to above, the systems and processes above are not limited to use of photopolymers as the photosensitive medium alone. For example, composite materials (e.g., those that contain a filler material for a photopolymer, or those that combine the photopolymer with another polymer), can be employed as well. For example, if a ceramic body is desired, a polymer-ceramic matrix or a polymer-ceramic precursor matrix can be used in the LAMP systems and processes, followed by removal of the polymeric component, thereby leaving behind a ceramic green body that can be subjected to additional processing.

The well-known approach of exposing a photosensitive medium with a focused, raster scanning laser beam is used in conventional stereolithography systems, as well as in microelectronics manufacturing systems for mask writing, prototyping, customization of chips, and repair of defects. Such systems expose all the pixels one at a time on the substrate. The most widely used direct-write systems use an ultraviolet (UV) laser source. The laser source is focused to the desired spot size on the surface of the polymer to be cross-linked or the ceramic suspension to be photo-formed in stereolithography, or on a substrate coated with a photosensitive material in the platesetting print industry, or on a substrate coated with photoresist in microelectronics manufacturing. The focused spot can be modulated as the beam is raster scanned across the substrate. In principle, these are maskless systems. Because transfer of the pattern information by such tools takes place in a slow, bit-by-bit serial mode, typical substrate exposure times can range from several minutes to several hours per square foot. Some raster-writing tools use multiple rastering beams to overcome the low-throughput problem, while only partially achieving the objective. Other raster-writing tool concepts have been developed in the last few decades, but due to their low throughputs, all such systems are suitable only for low-volume or one-of-a-kind applications such as prototyping or mask fabrication, and are unattractive for cost-effective manufacturing in high or even moderate volumes.

In an exemplary embodiment, the SLM is a two-dimensional array of approximately one million micro-pixels, each of which can be individually turned ON or OFF. In the ON position, illumination that is incident on the pixel is directed toward a high-resolution projection lens and imaged onto the photosensitive medium. In the OFF position, the illumination incident on the pixel is deflected away from the entrance numerical aperture (NA) of the projection lens and not permitted to reach the substrate. The SLM is controlled by the control system, which can include a computer. The computer accesses CAD files containing the ON/OFF states for all of the pixels in an entire frame, e.g., a bitmap frame.

Computer-to-conventional plate (CtCP) lithography technology can utilize SLMs as programmable, massively parallel write-heads, as illustrated in FIG. 3. In an exemplary embodiment, the CtCP system can be manufactured by BasysPrint's UV Series 57F machine equipped with a single DMD-based scanning head, which was commercialized in the early 2000s. The success of this technology led to the 700 series UV platesetters with two DMD-based scanning heads working in tandem to achieve process throughput that was orders of magnitude higher than single laser beam writing techniques.

Figure 3A:
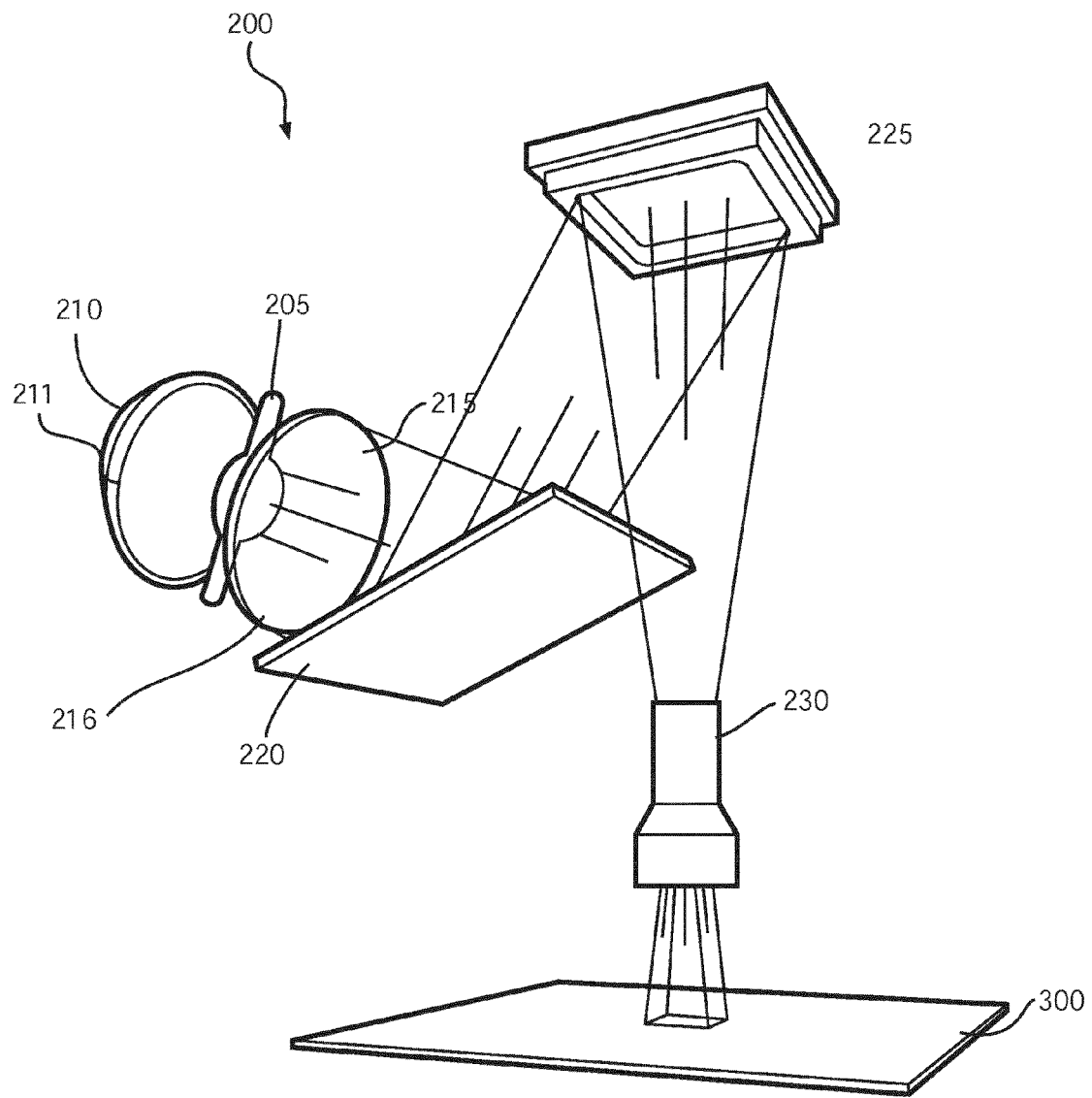
FIGS. 3A-3B are perspective views of a large area maskless photopolymerization (LAMP) system, in accordance with an exemplary embodiment of the present invention.
Figure 3B:
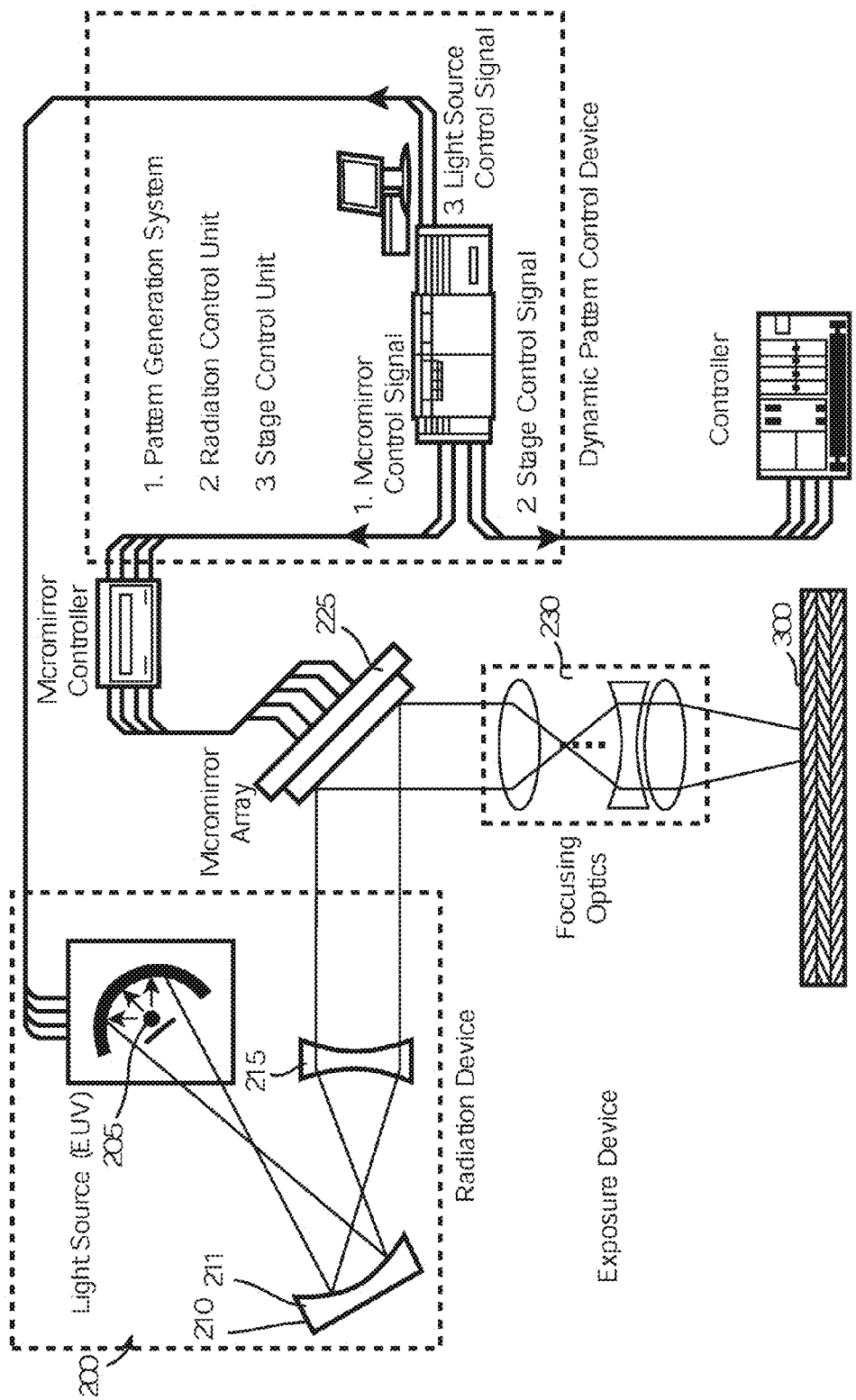

FIGS. 3A-3B illustrate a perspective view of an optical imaging system providing a light source to a given surface, in accordance with an exemplary embodiment of the present invention. The LAMP system 100 for fabricating a three-dimensional object includes the optical imaging system 200. The optical imaging system 200 or radiation system includes a light source 205, a reflector system 210, an optical lens system 215, a mirror 220, at least one SLM 225, e.g., a DMD, and a projection lens 230.

The light source 205 can illuminate, and thus provide a light. Various embodiments of the present invention can include light sources comprising any one of an ultraviolet light, violet light, blue light, green light, actinic light, and the like. In an exemplary embodiment, the light source has a particular, predetermined wavelength in the UV spectrum.

Embodiments of the present invention may be described herein as a UV light source, but embodiments of the present invention are not limited to such a light source, and other light sources, including the examples disclosed can be implemented.

The light emitting from the light source 205 can be projected upon a portion of the reflector system 210, and reflects from the reflector system 210, which can comprise a concave-shaped reflector 211. The reflector 211 of the reflector system 210 directs the light through a lens 216 of the optical lens system 215 before it reaches the mirror 220. The mirror 220 then reflects the light towards the DMD 225. The light from the DMD 225 is next directed towards the projection lens 230. The light from the projection lens 230 is then projected onto the surface 300 of the photosensitive medium.

In an exemplary embodiment, the BasysPrint device can incorporate the optical imaging system. In such an embodiment, BasysPrint's massively parallel scanning device can include a single DMD-based SLM. If desired and/or necessary, the BasysPrint device can be extended to multiple DMDs working in parallel.

Figure 4:
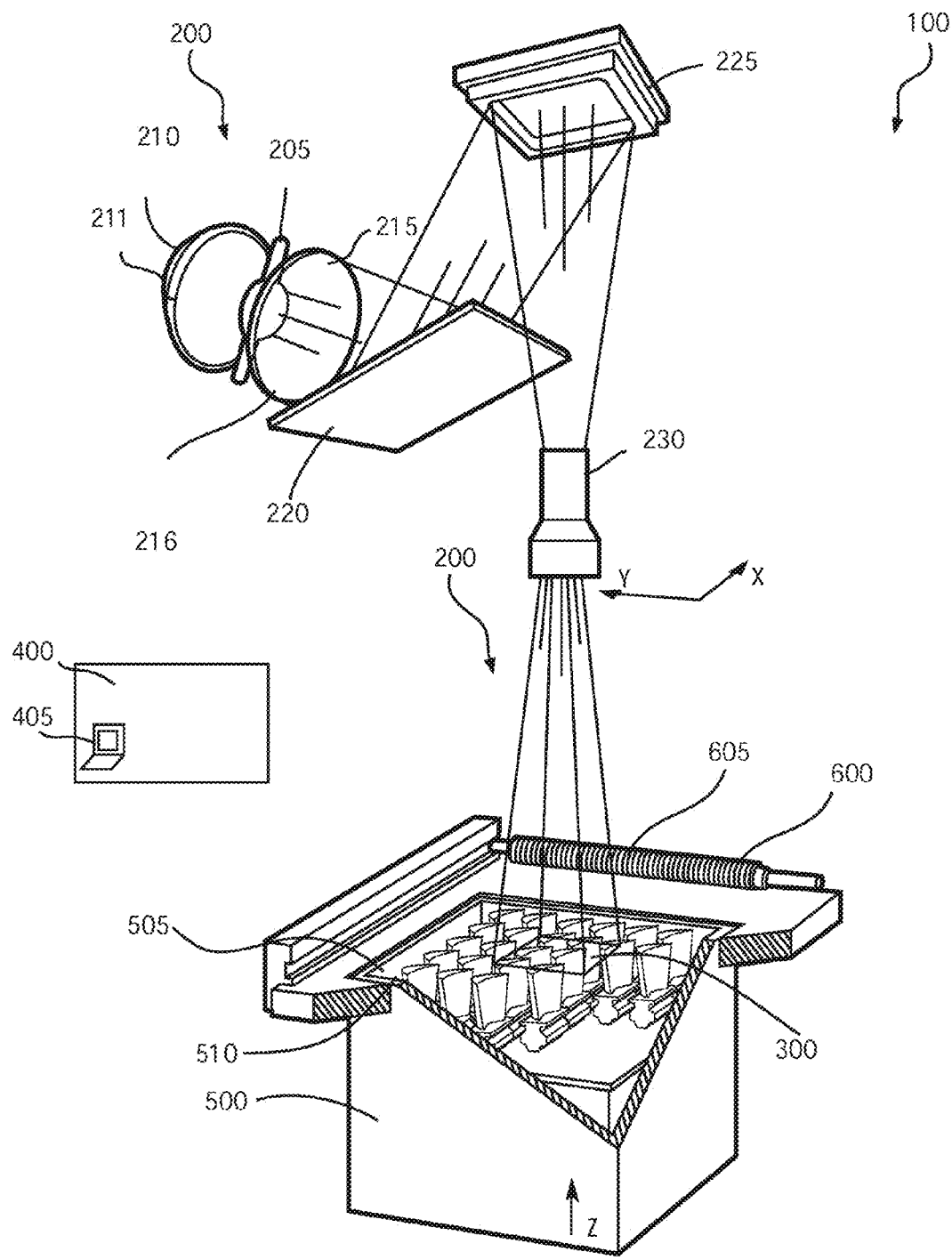
FIG. 4 is another perspective view of the LAMP system, in accordance with an exemplary embodiment of the present invention.

FIG. 4 illustrates a perspective view of an exemplary embodiment of the optical imaging system 200 emitting light onto a given surface 300 of the photosensitive medium. In essence, FIG. 4 illustrates a schematic of an SLM-based CtCP scanning maskless imaging system.

In an exemplary embodiment, the UV light source 205 can be a mercury vapor lamp, xenon lamp, violet laser diode, diode pumped solid state laser, frequency-tripled Nd:YAG laser, XeF excimer laser, or the like. The UV light source 205 can illuminate an SLM or an array of SLMs, e.g., one by two, such that the beams reflected from the ON pixels of the SLM array are coupled into the projection lens while the beams from the OFF pixels are directed away from the lens. The elements of the SLM, e.g., a DMD, 225, nominally approximately 15 micrometers (μm) square in size, are individually controllable by the CAD data from the computer, enabling rapid, programmable selection of a large number of sites for laser irradiation. The DMD 225 can modulate the illumination by means of its bi-stable mirror configuration, which, in the ON state, directs reflected illumination toward a projection lens, and in the OFF state, directs illumination away from the lens.

The entire optical imaging system 200 can be mounted on an X-Y scanning stage with a large area of travel spanning several hundred millimeters. As the optical imaging system 200 is scanned over different areas of the medium, e.g., the substrate 300, the projection lens 230, with the appropriate magnification or reduction, images the ON pixels of the SLM array directly onto the substrate 300. The projection lens 230 reduction ratio may be between approximately 1 and approximately 50, which can result in a minimum feature size between approximately 15 microns and approximately 0.3 microns. Each pixel in the array is digitally controlled to be either ON or OFF. A desired pattern corresponding to an input bitmap image (e.g., BMP, TIFF, and the like files) can be generated by the SLM by loading the array with bitmap data that configures each pixel. When a different pattern is needed, a different bitmap data set can be loaded. In effect, the SLM can be a rapidly programmable structured light pattern generator that can reproduce an entire bitmap image with high fidelity across a large area substrate.

Comparing SLMs to serial exposure via laser direct-write techniques, SLMs enable massively parallel processing by exposing an entire image field in a single shot. The digital signal processing electronics integrated into commercial SLMs can support a high frame rate (several kHz) allowing the exposure image data to be refreshed continuously such that large areas of a substrate (photosensitive medium) can be continuously scrolled and dynamically exposed by scanning at high speeds.

Figure 5:
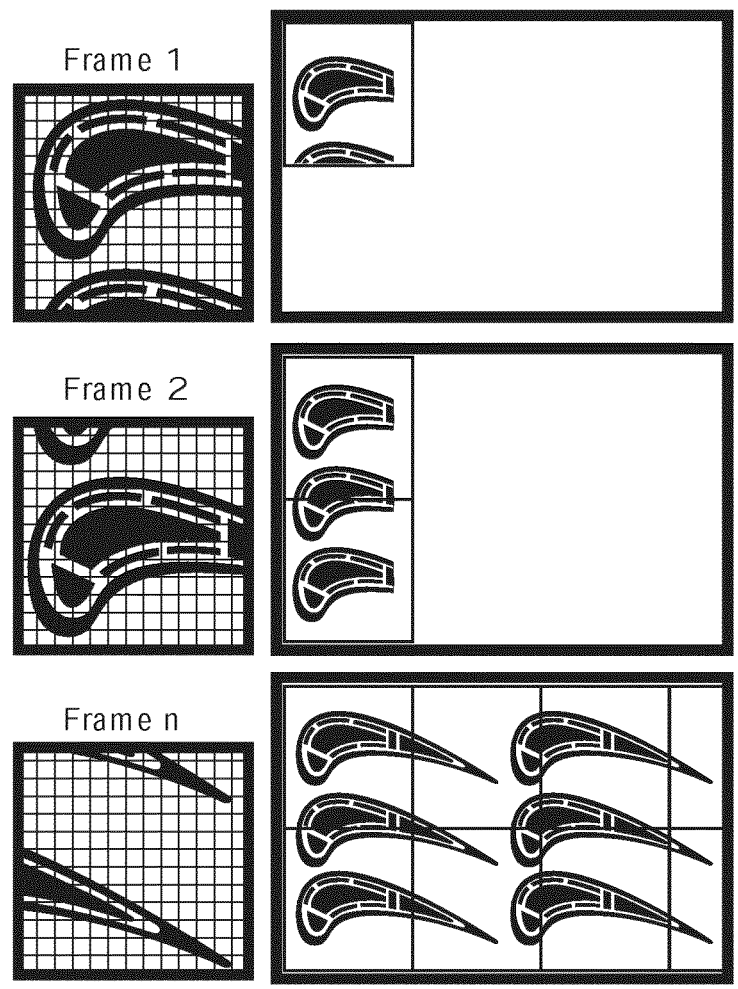
FIG. 5 is an exemplary computer aided design slice pattern, in accordance with an exemplary embodiment of the present invention.

FIG. 5 illustrates exemplary computer aided design slice patterns of a turbine airfoil mold, in accordance with an exemplary embodiment of the present invention. In other words, the seamless scanning configuration of a maskless imaging system for projecting CAD slice patterns of multiple airfoil molds on a large area is illustrated in FIG. 5.

As described, the optical imaging system 200 can be mounted on an X-Y stage, and is scanned while the SLM sends a sequence of frames. Each frame, e.g., see exemplary frames in FIG. 5, represents a portion of a full pattern, mimicking a mask scanning synchronously with the substrate. The SLM is illuminated by a pulsed UV light source 205 while the pulses are synchronized to the data stream that configures the SLM. As the optical imaging system 200 scans over the substrate 300, the data sent to the SLM is continuously and synchronously updated, line-by-line, and frame-by-frame, delivering the entire pattern information to the substrate 300 during its scanning motion. The SLM operates such that the entire array is reconfigured for each pulse to properly form the correct image on the substrate. The desired image on the substrate 200 can be digitized and fed to the SLM as a stream of data in a similar fashion as used in raster-writing systems. The difference between the SLM-based imaging system and conventional raster-writing methods is that the massively parallel processing power of the SLM is utilized to increase the data throughput by many orders of magnitude.

Exemplary embodiments integrate layered manufacturing of complex three-dimensional objects by solid freeform fabrication (SFF) using photocurable resins with the fine-feature resolution and high throughput of direct digital computer-to-plate (CtP) lithography techniques from the printing industry. These techniques have recently advanced to dramatically increased throughput by using SLMs to pattern large-area photosensitive plates directly from computer-processed bitmap images for making print masters. This integration of technologies achieves a disruptive breakthrough in part build speed, size, and feature definition over current SFF methods. Exemplary embodiments can provide an ability to rapidly manufacture parts or objects that have macro-scale exterior dimensions (approximately a few centimeters) and micro-scale interior features (approximately microns to approximately tens of microns). Furthermore, exemplary embodiments can be well-suited for mass production of state-of-the-art integral ceramic cored molds for casting turbine airfoils directly from digital information.

Referring back to FIG. 4, it illustrates a perspective view of a system and method for fabricating three-dimensional objects, in accordance with an exemplary embodiment of the present invention. That is, a LAMP system 100 is illustrated in FIG. 4, and illustrates layer-by-layer simultaneous fabrication of several objects—in an exemplary embodiment airfoil mold structures—over a large area.

In operation, light from UV light sources 205 of the optical imaging system 200 is conditioned and conveyed through optics. The UV light sources 205 are conditioned and conveyed through transmissive and reflective optics onto an array of SLMs 225.

The SLM array can receive a real-time video stream of CAD data-slice bitmap images from the control system 400. A process control computer 405 of the control system 400 can turn the corresponding pixels in the array ON or OFF. As described, the light from the ON pixels can be reflected downwards and transmitted into the projection lens system 230.

The projection lens 230 can convey highly focused images at the rate of several kilohertz (kHz) corresponding to the ON pixels onto the surface 300 of a photosensitive medium in the material build platform 500. The optical imaging system 200, including the light source 205, optics 215, SLM array 225, and projection lens 230, can be scanned along the X and Y axes at high speeds to continuously expose new areas of the resin 300 synchronously with images that are continuously refreshed on the SLM array. When the entire surface area of the resin 300 has been scanned and exposed, the surface of material build platform 500 can be moved downward along the negative Z-axis by a slice layer thickness, and a new layer of photocurable material can be swept by a material recoating system 600.

The material recoating system 600—which for illustration purposes is shown as a wire-wound draw-down bar—sweeps uniform thickness layers of the photosensitive medium at high speeds across the interior of the material build platform 500, without disturbing the previously built layers. Once a new layer of the photosensitive medium has been formed, focusing and alignment optics can ensure that the surface of the medium is at the focal plane of the projection lens, making fine adjustments in the Z-direction if necessary. Upon completion of this step, the LAMP process repeats the cycle of building the next layer and delivering new resin until the entire build is completed.

Figure 6:
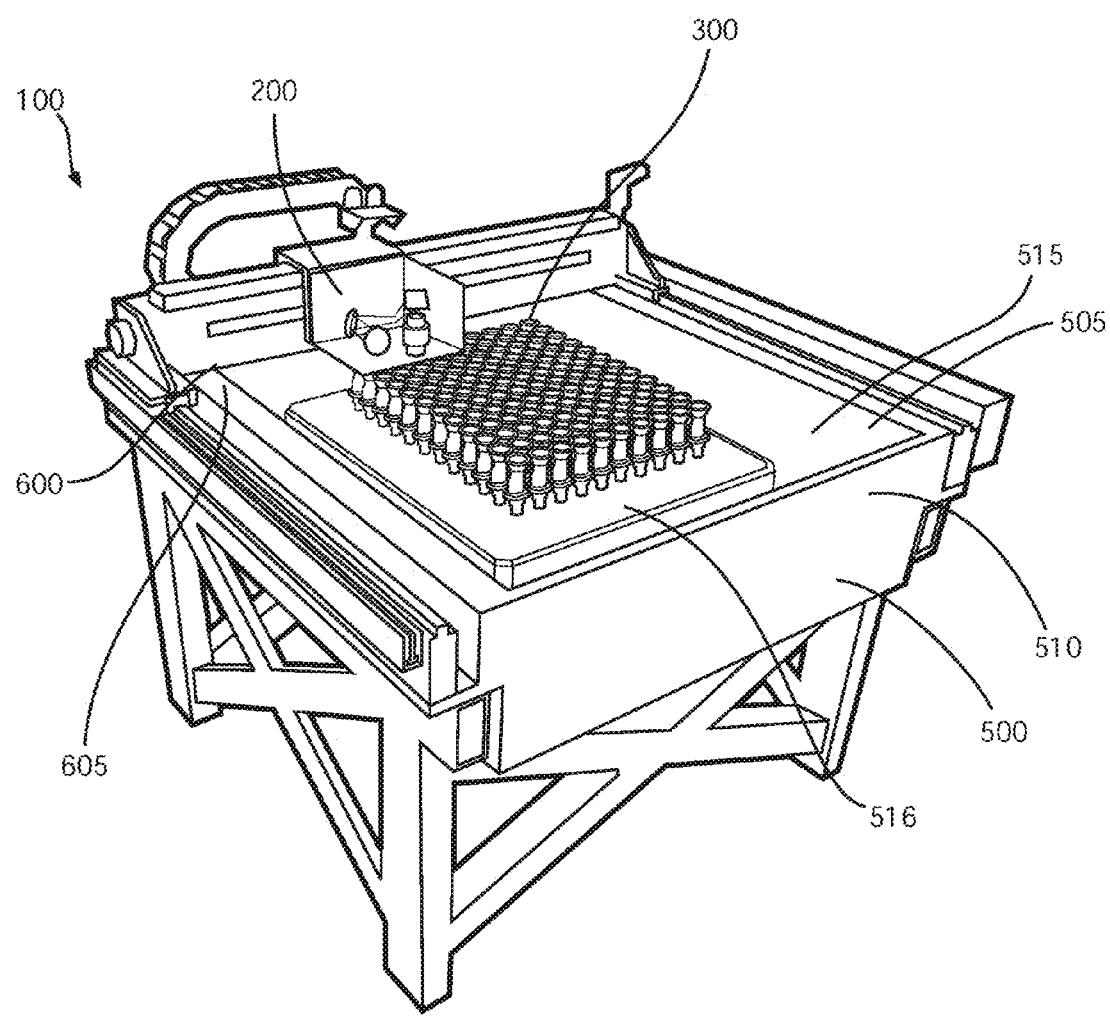
FIGS. 6-7 are perspective views of the LAMP system for fabricating the three-dimensional objects using a maskless optical imaging system, a material build platform, a material recoating system, and a control system, in accordance with an exemplary embodiment of the present invention.
Figure 7:
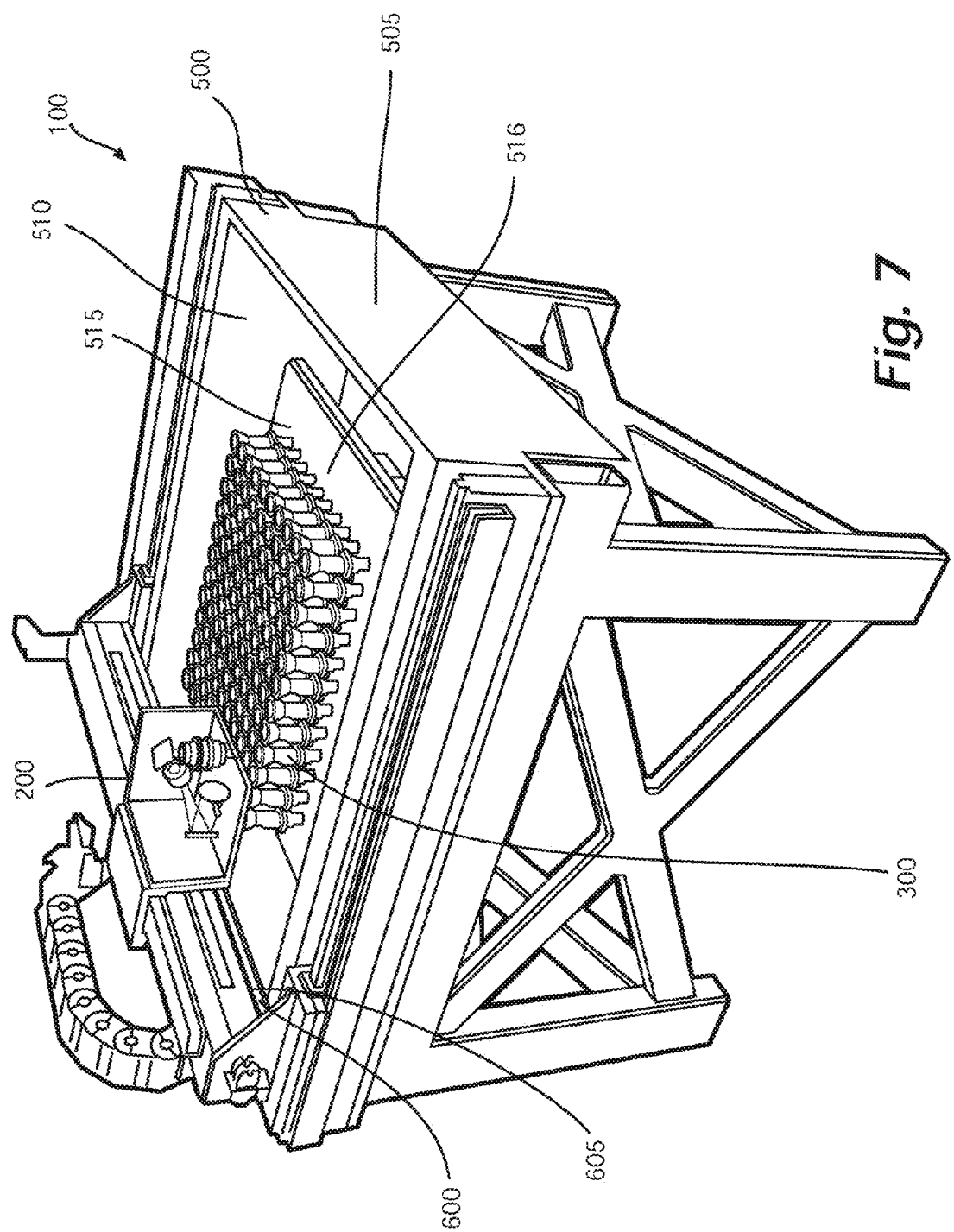
Figure 8:
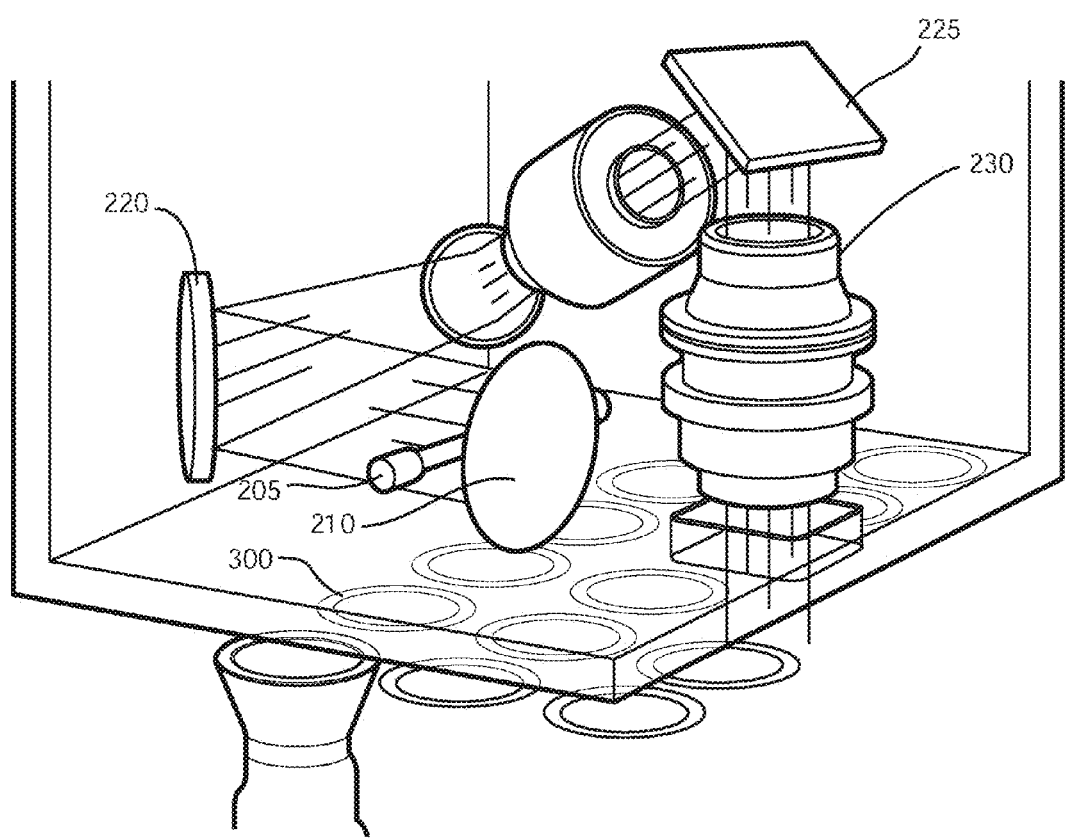
FIG. 8 is a perspective view of an optical imaging system for the LAMP system, in accordance with an exemplary embodiment of the present invention.

As shown in FIGS. 4 and 6-7, the system and method for fabricating the three-dimensional object includes a maskless optical imaging system 200, a container 500 for holding the medium, material recoating system 600, and the control system 400. In an exemplary embodiment, the LAMP system 100 can include: (1) a maskless optical imaging system (MOIS) for exposing the patterns into a photosensitive medium; (2) the material build platform (MBP) for layer-by-layer UV curing and freeform fabrication of a three-dimensional object; (3) the material recoating system (MRS) for rapidly coating approximately 25-100 μm uniform thickness layers of the photosensitive medium onto the MBP; and (4) the control system comprising hardware and software interfaces with the MOIS, the MBP, the MRS, and with 3-D CAD data bitmap slices in order to enable a completely automated and synchronized LAMP system.

When the optical imaging system is a maskless optical imaging system or MOIS 200, MOIS 200 can comprise the UV light source, beam homogenization optics, mirrors, condenser optics, illumination optics, an array of SLMs, and the projection lens system. In addition, the MOIS 200 can comprise a UV light source light source, transmission and condenser optics, array of spatial light modulators (SLMs) (e.g., DMDs), projection lens system, and high-precision X-Y scanning stage. MOIS 200 can utilize scanning exposure with the SLM array having well in excess of a million modulator elements. The MOIS 200 exploits state-of-the-art SLM 225, such as DMD chips (e.g., from Texas Instruments) with 1024×768 pixels and with an approximate 10 kHz frame rate. In addition, MOIS 200 exploits extensive software algorithms to coordinate and synchronize the SLM data frames and the position information of the scanning optical imaging system over the MBP.

MOIS 200 can be mounted on an overhead gantry style precision X-Y motion stage with sub-micron position resolution for achieving a minimum in-plane feature resolution of at least approximately 15 μm with an error of approximately ±1.5 μm. The X-Y motion stage can scan over the entire MBP 500 at high speeds (e.g., approximately several hundred mm/s) to expose different areas of the top surface of the MBP 500 that has a new unexposed layer of the photosensitive medium.

In an exemplary embodiment, the MBP 500 can comprise a container 505 that serves as the build volume 510. The MBP 500 can incorporate a build substrate mounted on a high-accuracy z-translation stage for building an object in layers e.g., 25 micrometer (and larger) thicknesses using the photosensitive medium. Thinner layers of the photosensitive medium can be created when the dimensions of a feature of the three-dimensional object require so. Similarly, when the dimensions of a feature of the three-dimensional object are large, thicker layers of the photosensitive medium can be used. In an exemplary embodiment, the overall dimensions of the overall build volume 510 can be approximately 24 inches (X) by 24 inches (Y) by 16 inches (Z) (24"×24"×16"). A build surface 515 made of a precision machined plate 516 can be located within the build volume 510 (i.e., in the MBP's interior) and can be mounted on a precision linear motion stage for motion in the Z-direction. During the fabrication of a part, the build surface 515 can be moved incrementally downwards by a distance equal to the layer thickness with which the part is being built. The control system 400 can control this downward movement.

In an exemplary embodiment, the MBP 500 can be constructed using a precision linear positioning system with sub-micron resolution for achieving a minimum build layer thickness of approximately 25 μm with an error of approximately ±2.5 μm. When the entire surface area of the MBP 500 has been scanned by the MOIS 200 and the exposure has been completed, the build surface 515 can move down via its downwardly moving plate 516, and the MRS 600 can apply a new layer of the photocurable ceramic material.

The MRS 600 can comprise a coating device 605, which can be, without limitation, a wire-wound Mayer draw-down bar, a comma bar, or a knife edge or a slurry dispensing system. The MRS 600 can incorporate a coating device capable of applying coatings as thin as approximately 2.5 microns with 0.25 micron variation. The MRS 600 can be designed to successively deposit the layers of the photosensitive medium. During a part build, upon the completion of a layer exposure, the MRS 600 can quickly sweep the medium across the build area under computer 405 control. The MRS 600 can implement principles from the web-coating industry, where extremely thin and uniform coatings (on the order of a few micrometers) of various particulate-loaded formulations are deposited on fixed, flat, or flexible substrates.

In an exemplary embodiment, the photosensitive medium can comprise a concentrated dispersion of refractory ceramic particles in a photopolymerizable matrix. The ceramic particles can, after firing, produce a high quality ceramic object. In an exemplary embodiment, the photopolymerizable matrix can be a mixture of camphor with an acrylic monomer, formulated so that it is solid at room temperature, but liquid when warm (above about 60° C.). Camphene may be selected due to of its convenient melting point, and because solid camphene has a high vapor pressure, making it easy to remove by sublimation. Liquefied resin can be supplied warm to the recoating system, and applied on the material build platform as a thin liquid layer. It can quickly freeze, providing a smooth solid surface. Exposure to the UV can cross-link the monomer, rendering the exposed areas infusible. After building all the layers, heating the block of build material above about 60° C. can melt away the unexposed material, which drains as a liquid. After draining, the solid camphene can be removed from the green body by sublimation at or slightly above room temperature. Next, after sublimation the LAMP-fabricated mold can be a dry body containing enough polyacrylate for high green strength, but not so much that special binder-burnout is required before firing.

The solid build material can further provide sharper curing profiles, and can improve resolution. A solid build material may not require a liquid vat with associated issues of flow-related disturbance of the previously-exposed layers. Consequently, recoating can be done much faster and with thinner layers, because the higher shear forces from the recoating device may not disrupt underlying solid layers.

In addition, eliminating liquid flow in a vat enables the build platform to be rapidly translated in the X-Y directions. Consequently, the mechanics of the exposure and optical system design are greatly simplified, improving precision and repeatability.

The solid build material that the support structures are inside may not be needed. Support structures are endemic to 3-D free-forming from liquid materials. A layer that has overhangs (such as a curved part) cannot float in space, so the build software produces a temporary scaffold to support it, i.e., a support structure. After doing a conventional SLA build, the support structures need to be removed. But if the object is a metal casting mold, the cavity on the inside of the mold is the relevant surface, and an interior support structure cannot be simply removed. Careful consideration of the design is required to find optimal build directions where support structures are not needed. Solid build materials do not require support structures, because the overhangs are supported by the solid (but uncured) material below.

Silica is an exemplary ceramic material, whereas the LAMP process can be applied to a wide range of ceramic materials. Alumina- or yttria-containing photosensitive media can be produced, for example, to cast more reactive superalloys (for making turbine airfoils) that require alumina or yttria molds. Adjusting exposures for the alumina-based or yttria-based resin causes a different sensitivity for photopolymerization. Sensitivity in ceramic-containing resins is mostly limited by light scattering, which depends upon the refractive index of the ceramic and also on the particle size distribution and suspension structure affecting photon transport. The refractive index of silica is close to the monomer, so silica resins are very sensitive. Alumina and yttria have higher refractive indices and so they require a higher exposure dose.

A new photosensitive medium can be developed taking into account the rheological behavior of the medium material in the liquid state, the photocuring behavior of the medium, the clean draining of the uncured medium, cured polymer removal, firing, and the refractory properties of the final fired ceramic object.

Development of a solid medium can adopt the successful terpenoid-based vehicles, such as camphor, which can be removed after forming by sublimation. This eliminates nearly all drying and binder burnout issues. The rheology of ceramic powders in warm liquid terpenoids is well understood, and effective colloidal dispersants are commercially available. Detailed information is available on solidification of camphor and camphene at room temperature, as these have been a preferred model system for solidification research. The solidification of concentrated ceramic suspensions is also well understood. Preliminary results of the photopolymerization behavior of solid photosensitive medium based on terpenoid-acrylate monomers are encouraging. Solid polymers are routinely used in pre-press platesetting print industry, as well as in photolithography.

The photocuring characteristics of the ceramic-containing resins as a function of composition and properties may be tailored to develop an optimized PCMS composition. Examples of ceramic-containing resins for use as the photosensitive medium and of their manipulability can be found in U.S. Pat. No. 6,117,612, which is incorporated by reference herein as if fully set forth below.

The control system 400 can comprise the PCS 405 for the LAMP system 100. In essence, the PCS 405 forms the brains of the LAMP system 400 and is the central processing unit of the system, responsible for automation functions. The PCS 405 can include the software algorithms to conduct adaptive slicing of the integral cored mold CAD files for optimized layer thickness, part surface finish, avoidance of stairstepping, and minimum build time as a function of critical features and feature sizes present in the mold design. The PCS 405 further can include the algorithms and signal communication logic for coordinating the motion of the MBP, the MRS, and the MOIS for automated layer-by-layer material delivery, scanning, and photo exposure to build 3D parts in the shortest possible time with the least possible idle time in the LAMP machine. Software algorithms can process the CAD data slices into the stacks of images (e.g., see FIG. 10A) necessary to be flashed to the SLMs at the high rates necessary for seamless and maskless exposure of the photosensitive medium as the MOIS moves at high speeds over the MBP. Software algorithms can also adaptively adjust the exposure dose in real-time as a function of slice layer thickness to achieve the necessary full cure depth through the layer thickness regardless of the layer thickness.

Figure 9:
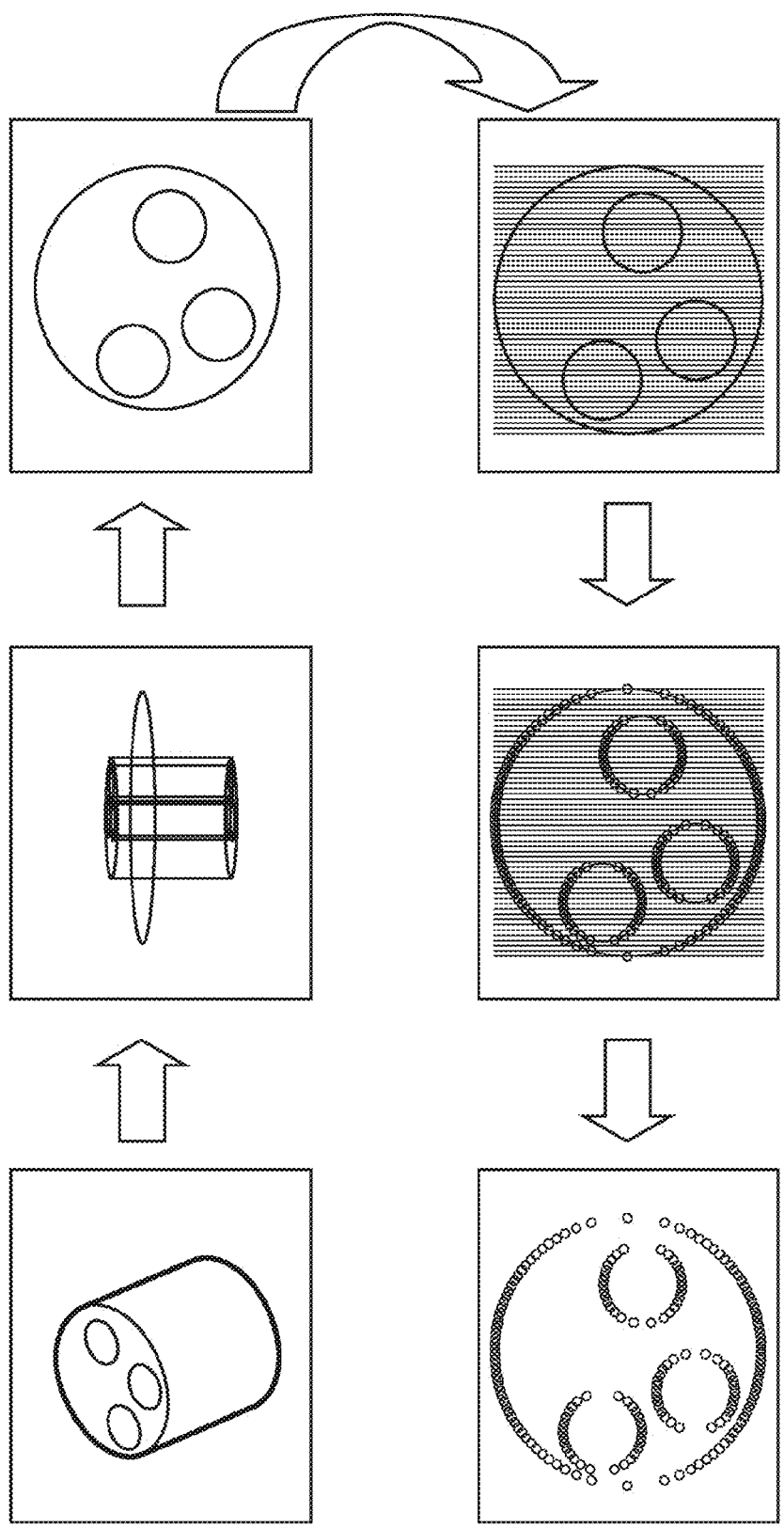
FIG. 9 illustrates a plurality of cross-sectional views of a three-dimensional computer aided design drawing, in accordance with an exemplary embodiment of the present invention.
Figure 10A:
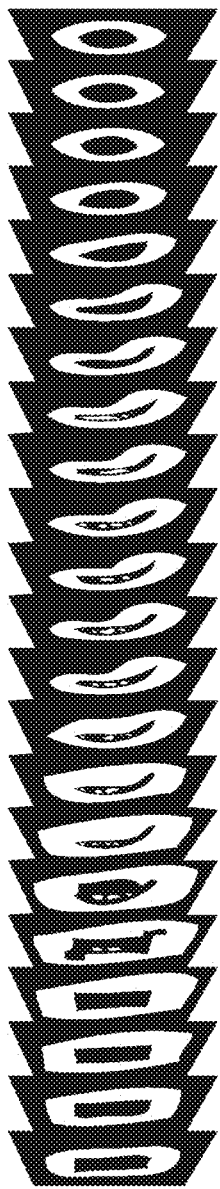
FIG. 10A illustrates a plurality of stacked cross-sectional views of the two dimensional computer aided design drawings, in accordance with an exemplary embodiment of the present invention.
Figure 10B:
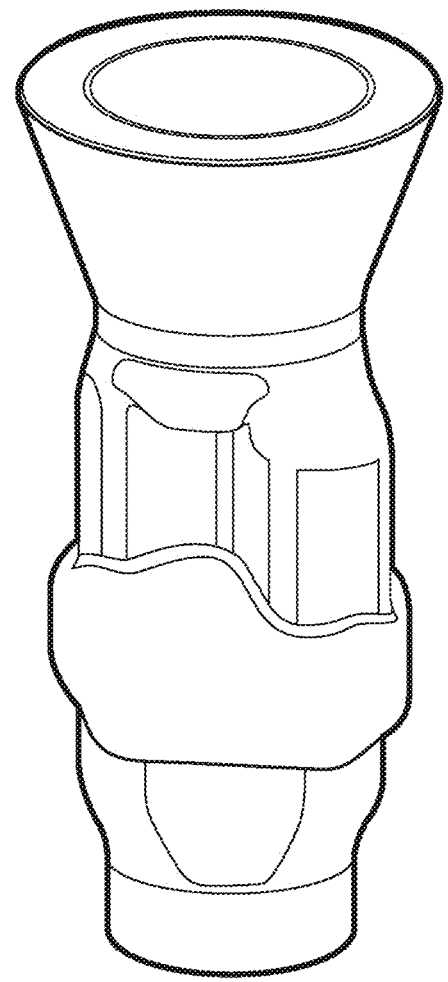
FIG. 10B illustrates a perspective view of a three-dimensional object from the stacked cross-sectional views of the two-dimensional computer aided design drawings of FIG. 10A, in accordance with an exemplary embodiment of the present invention.

The overall PCS and user interface for the LAMP system that can integrate the software algorithms and signal communication logic. The PCS can include all the necessary CAD data interfaces, machine automation and control hardware and software interfaces, and fault detection and recovery in order for the LAMP machine to function as a fully automated, operator-free solid freeform fabrication (SFF) machine. For example and not limitation, FIG. 9 illustrates a plurality of cross-sectional views of a 3D CAD drawing, and FIG. 10A illustrates a plurality of stacked cross-sectional views of the 3D image that results in the turbine airfoil mold 3D casting of FIG. 10B.

Intelligent adaptive slicing algorithms optimize build speed and throughput while at the same time carefully accounting for necessary feature resolution and/or surface finish embedded in each slice layer thickness. For example, sections of the integral cored mold containing critical features may be sliced at approximately 25 micron layer thickness, while other regions corresponding to the platform and pour cup with non-critical features or mostly vertical walls can be sliced at approximately 100 microns or larger layer thickness. Data transfer and file format protocols transmit the CAD slice data to the SLM array. Intelligent software and hardware algorithms convert the CAD data slices to the stack of image frames necessary to be flashed at a high refresh rate to the array of SLMs in the MOIS.

FIGS. 6-7 illustrate an exemplary LAMP device illustrating the optical imaging system, the material recoating system, and the material build platform. In other words, FIGS. 6-7 are conceptual schematics of the LAMP system showing the MOIS, the high-precision X-Y scanning stage, the MRS, and the MBP.

The MOIS 200 is shown in greater detail in FIG. 7. The MOIS 200 can transform the non-uniform output from the UV light source 205 into a rectangular beam of uniform intensity that illuminates the SLM array after being redirected by two mirrors and after passing through condenser optics. The SLM array or DMD 225 can be illuminated at an angle with respect to the normal of the pixel plane, because the ON mirrors tilt to direct the light into the projection lens. The projection lens 230 magnifies or reduces the image with the appropriate ratio and projects the image onto the surface of the medium in the MBP 500, which is located at the focal plane of the projection lens. The MOIS 200 is mounted overhead gantry style on an X-Y scanning stage and is traversed preferably over the MBP 500, while the SLM sends a sequence of frames. Each frame represents a portion of a full continuously scrolling pattern that covers the entire exposable area of the MBP 500. The SLM can be illuminated by a pulsed UV light source that is synchronized to the SLM data stream. As the substrate moves, the data sent to the SLM is continuously updated, row-by-row, and frame-by-frame of the micromirror array, delivering the entire pattern information to the substrate during its scanning motion. Considering that there can be between approximately 780,000 and 1,300,000 micromirrors on the DMD device, the massively parallel processing power of the SLM is utilized to increase the photopolymerization throughput by at least six orders of magnitude over that of a single point laser light source, as is the case in stereolithography.

Calculations indicate that the exposure time required to photopolymerize through the thickness for each slice of a part is on the order about five milliseconds. Commercial high-speed scanning stages can move the optical imaging system at speeds of 400-600 mm/s, so 200 parts can be exposed in a 24 inches by 24 inches build area within approximately one second. A time budget of one second for exposure means that recoating a layer should take no more than four seconds. This means that the recoating device can move at relatively high speeds, upwards of approximately 100 mm/s to traverse the 24 inch (610 mm) length of the build platform in less than four seconds. The recoating device can successfully coat a new layer of the photosensitive medium at speeds of approximately 300 mm/s to approximately 1500 mm/s (approximately 1-5 ft/s). These types of coating speeds, commercially in use in the converting and web coating industry enables the system to meet the critical time budget per layer, while achieving the high throughput necessary to make LAMP a cost-effective process. Calculations further reveal that by implementing adaptive slicing to use thinner layers (e.g., approximately 25-75 micrometers) in regions of the part containing critical features and thicker layers (e.g., approximately 250 micrometers) elsewhere, the part build rate can be increased to at least approximately 90 parts per hour, resulting in a cost savings of approximately 25-30% per part.

Superalloy objects, e.g., airfoils, are currently cast using silica-based shell molds and cores. The photosensitive medium for the integral cored molds to be produced through the LAMP process can be designed and developed based on a silica formulation. A formulation can be modeled on the same composition used for conventional cores and shell molds. Using a substantially identical mold composition is helpful for acceptance of superalloy airfoils made by LAMP, because mold chemistry cannot be changed without significant work to re-qualify a component. Silica can be the refractory material because it is relatively easy to remove by leaching after casting. In accordance with an exemplary embodiment, at least two photocurable ceramic media or materials can be used: 1) a liquid ceramic resin, and 2) a solid ceramic resin.

In a first embodiment, the photocurable ceramic material can be a liquid ceramic resin, based on existing stereolithography resins. Such resins contain approximately 50-60 vol % suspensions of ceramic particles in a low viscosity fluid monomer (non-aqueous acrylate or aqueous methacrylate). Such formulations are understood and have been well characterized in the art. The liquid ceramic resin is locally solidified by photopolymerization where it is exposed to UV light.

After the build is complete, the integral cored mold is a solid ceramic-filled photopolymer in a vat of liquid resin. The excess resin drains away after the mold is removed from the vat. The as-cured mold must undergo a binder burnout process (approximately 200-500° C.) to remove the polymer without damaging the mold. Liquid resins, however, have many disadvantages, including: (1) they cure to a "green" build state that is composed of a ceramic in a polymer in the case of acrylate, requiring careful binder pyrolysis, or a wet ceramic in wet hydrogel (aqueous methacrylate) which requires careful drying. Both of these are controllable for the thin sections relevant for the molds, but place a constraint on the process; and (2) they require support structures to be built along with the part for some designs.

In a second embodiment, the photocurable ceramic material can be a solid ceramic resin including a solid, sublimable monomer solution. This can include a build material that can be applied as a liquid, but one that freezes upon application to form a photopolymerizable solid. For example, this can be accomplished using a monomer in a molecular solid solvent. The solid solvent can be a low-melting vehicle that melts above about approximately 50° C. (e.g., a camphor-camphene alloy). In the molten state, it is a fluid suspension of approximately 50-60 vol % ceramic powder in a low viscosity monomer-vehicle solution. A fresh layer of material can be applied as a warm liquid, which freezes after application creating a solid build material. The frozen solid ceramic resin is locally cross-linked by photopolymerization where it is exposed to UV light. After the build is complete, the integral cored mold is a solid ceramic-filled cross-linked photopolymer in a block of frozen solid resin. The block is simply heated above the melting point of the vehicle, so that the uncured excess resin drains away. The remaining camphor in the as-cured mold is removed by sublimation after building (ambient temperature freeze drying). After sublimation, only a small amount of cured monomer remains, so binder burnout is much easier.

Camphene is a non-toxic material derived from pine trees (a terpenoid), and melts just above room temperature (50° C.), but is a solid at room temperature. Camphor is a similar material, with a higher melting point. These terpenoids can be used for freeze casting of ceramic suspensions. The solid camphene (or camphor) is easily sublimed, so that after forming it can be removed by sublimation. This eliminates difficulties associated with binder polymer pyrolysis (as with polyacrylates) and liquid drying of hydrogels (as with aqueous methacrylates). The sublimation is a gentle solid-vapor transformation that results in no dimensional change, and hence there is little or no warping or cracking.

Post-processing and firing development efforts can be necessary to achieve functional ceramic devices. The LAMP process may build "green" ceramic devices, including ceramic powder in a photopolymerized binder. Draining the devices of uncured ceramic resin may be necessary, and effective procedures for draining, flushing, and removal of all loose materials may further be necessary. After draining is complete, the as-built "green" ceramic devices can be successfully fired for polymer removal and sintering to create strong objects with the correct mineralogy and functionality.

While reference was made herein to turbine airfoil molds, the embodiments of the present invention have wide-ranging applications beyond turbine airfoils. The embodiments disclosed herein allow for the design and manufacture of components that would otherwise be difficult or impossible to manufacture conventionally. With respect to ceramic-containing LAMP products, the disclosed embodiments can radically change how the casting of nearly any component that employs temporary cores and molds is done worldwide.

The various embodiments of the present invention are further illustrated by the following non-limiting example. LAMP was used to build complex 3D products by photopatterning many thin layers of a UV-curable resin. An exemplary UV-curable resin contains approximately 76 weight percent silica powder prepared by grinding fused silica to an average particle size of 7 microns, 19.17 weight percent SR238 monomer (Sartomer, Warrington Pa.) and 2.34 weight percent SR494 monomer (Sartomer, Warrington Pa.), 1.58 weight percent Variquat CC55 dispersant (Degussa), and a photoinitiator, such as 0.86 weight percent Irgacure 819 (Ciba-Giegy). Other photoinitiators, absorbers, or dyes may be added to modify the UV-curing characteristics as desired. A maskless optical imaging system scanned the UV-curable resin with a high resolution bitmap pattern to cure individual layers. Fresh layers were applied, and the process was repeated to generate complex objects on the order of 10 centimeters in size, with internal and external features on the size scale of about 50 micrometers. Refractory ceramic molds were produced using as the resin UV-curable suspensions of silica powders in acrylate monomers.

In one aspect of the present invention, there is a system for fabricating a three-dimensional object. The system includes an optical imaging system, a photocurable medium, and a control system. The optical imaging system provides a light source. The photocurable medium changes states upon exposure to light from the optical imaging system. The control system controls movement of the optical imaging system, wherein the optical imaging system moves continuously above the photocurable medium.

In addition, the optical imaging system comprises a reflector receiving a portion of the light; an optical lens system comprising a lens that receives a portion of the reflected light; a spatial light modulator for receiving the reflected light from the optical lens system; and a projection lens for focusing the light received from the spatial light modulator onto a surface of the photocurable medium. Alternatively, the optical imaging system includes a maskless light system for providing the light source and comprising a spatial light modulator scanning a portion of the medium. In an exemplary embodiment, the light continuously changes as the optical light system moves over the surface of the photocurable medium.

The photocurable medium can include a photopolymer. The control system can receive a computer aided design drawing.

The optical imaging system projects a two-dimensional image comprising a cross-section of a three-dimensional object to be formed, the two-dimensional image received from the control system, onto a surface of the medium. The projected two-dimensional image can be a dynamic image that continuously changes as the optical imaging system scans over the medium.

The system further comprises a container for housing the photocurable medium. The container includes a lower platform that can move downwardly for lowering away from the optical imaging system, wherein the container includes an inlet for introducing more of the photocurable medium therein.

The system further comprises a recoating system for rapidly coating a uniform thickness of the photocurable medium.

In another exemplary aspect, an optical modeling method in which a photocurable medium is exposed with a light beam to form a three-dimensional model includes a number of steps. The method comprises moving a maskless optical imaging system providing the light beam in a continuous sequence; presenting the light beam on a portion of the photocurable medium; lowering a plate upon which the photocurable medium resides; and applying a new layer of photocurable media.

The method can further include analyzing a plurality of two-dimensional computer aided designs; the light beam presented on the portion of the photocurable medium having the shape from one of the plurality of two-dimensional computer aided designs. In addition, the method can further include projecting the light beam that continuously changes as the light beam scans a surface of the photocurable medium. Further, the method can include providing a material build platform for housing the photocurable medium and the plate upon which the photocurable medium resides. The method may include directing the light beam to reflect off a reflector, through at least one lens system, and to a spatial light modulator.

The lowering of the plate upon which the photocurable medium resides occurs after the light beam is presented to the portion of the photocurable medium.

In another aspect, a method for fabricating a three-dimensional object comprises moving a maskless optical imaging system providing light in a continuous sequence; directing the light to reflect off a reflector, through at least one lens system, and into a spatial light modulator; analyzing a plurality of two-dimensional computer aided designs; presenting the light on a portion of a photocurable medium contained in a material build platform, the light presented on the portion of the photocurable medium having a pattern corresponding to one of the plurality of two-dimensional computer aided designs; projecting the light to continuously change as the light scans a surface of the photocurable medium; lowering a plate disposed within the material build platform upon which the photocurable medium resides, the lowering of the plate upon which the photocurable medium resides occurring after the light is presented to the portion of the photocurable medium; and applying a new layer of photocurable media to the material build platform.

While exemplary embodiments of the invention have been disclosed many modifications, additions, and deletions can be made therein without departing from the spirit and scope of the invention and its equivalents, as set forth in the following claims.

What is claimed is:

1. A method for creating a three-dimensional model comprising:
    moving a maskless optical imaging system in a continuous sequence with one micron positioning accuracy proximate a photosensitive medium;
    exposing a predetermined portion of the photosensitive medium to an energy source from the maskless optical imaging system;
    lowering a plate upon which the photosensitive medium resides with one micron positioning accuracy; and
    applying a new layer of photosensitive medium.

2. The method of claim 1, further comprising analyzing a plurality of two-dimensional computer-aided designs;
    the predetermined portion of the photosensitive medium corresponding to one or more shapes from one or more of the plurality of two-dimensional computer-aided designs.

3. The method of claim 2, wherein the plurality of two-dimensional computer aided designs correspond to a plurality of slices of a three-dimensional computer-aided design.

4. The method of claim 1, wherein a projection of the energy source continuously changes as the energy source scans the predetermined portion of the photosensitive medium.

5. The method of claim 1, wherein lowering of the plate upon which the photosensitive medium resides occurs after the light beam is presented to the predetermined portion of the photosensitive medium.

6. The method of claim 1, further comprising providing a material build platform for housing the photosensitive medium and the plate.

7. The method of claim 1, wherein exposing the predetermined portion of the photosensitive medium to an energy source further comprises:
   selectively directing a portion of the energy source to a lens using a plurality of individually controlled mirrors; and
   focusing the portion of the energy source selected by the plurality of mirrors onto the photosensitive medium with the lens.

8. The method of claim 7, wherein the lens has a reduction ratio of between approximately 1 and 50.

9. The method of claim 1, wherein the plate is lowered between approximately 25 μm and 250 μm using an adaptive slicing method.

10. A method for fabricating a three-dimensional object, the method comprising:
   analyzing a computer-aided design (CAD);
   moving a maskless optical imaging system with one micron positioning accuracy in a continuous sequence proximate a photosensitive medium;
   exposing a predetermined portion of the photosensitive medium with an energy source from the maskless optical imaging system by:
      directing a portion of the energy source with a spatial light modulator (SLM) into one or more lenses;
      focusing the portion of the energy source onto the photosensitive medium with the one or more lenses to expose a predetermined portion of the photosensitive medium;
   lowering a plate disposed within the material build platform upon which the photosensitive medium resides, the lowering of the plate upon which the photosensitive medium resides occurring after the light source is presented to the portion of the photosensitive medium; and
   applying a new layer of photosensitive media to the material build platform;
   wherein the portion of the energy source presented on the predetermined portion of the photosensitive medium corresponds to a portion of the CAD; and
   wherein the portion of the energy source continuously changes as the SLM scans the photosensitive medium.

11. The method of claim 10, wherein the SLM comprises a digital micromirror device (DMD).

12. The method of claim 10, wherein the SLM comprises a liquid crystal display.

13. The method of claim 10, wherein analyzing the CAD comprises slicing a three-dimensional CAD into a plurality of two-dimensional CAD.

14. The method of claim 10, wherein the energy source is pulsed on and off at a frequency equal to a frame rate of the SLM.

15. The method of claim 10, wherein the plate is lowered between approximately 25 μm and 250 μm using an adaptive slicing method to form a predetermined slice thickness.

16. The method of claim 15, wherein one or more new layers of a photosensitive medium are applied to the material build platform in layers of thickness between approximately 25 μm and 250 μm.

17. The method of claim 15, wherein the exposure step further comprises:
   varying the energy source based on the predetermined slice thickness.

18. The method of claim 17, wherein varying the energy source comprises varying the exposure time of the predetermined portion of the photosensitive media.

19. The method of claim 17, wherein varying the energy source comprises varying the intensity of the energy source.

20. The method of claim 17, wherein varying the intensity of the energy source comprises varying the power supplied to the energy source.

* * * * *